United States Patent [19]

Darwish et al.

[11] 4,205,342
[45] May 27, 1980

[54] INTEGRATED CIRCUIT STRUCTURE HAVING REGIONS OF DOPING CONCENTRATION INTERMEDIATE THAT OF A SUBSTRATE AND A POCKET FORMED THEREIN

[75] Inventors: Mougahed Y. Darwish, Fontaines; Henri J. Oguey, Corcelles, both of Switzerland

[73] Assignee: Centre Electronique Horologer S. A., Neuchatel, Switzerland

[21] Appl. No.: 898,681

[22] Filed: Apr. 21, 1978

[30] Foreign Application Priority Data

May 5, 1977 [CH] Switzerland ............... 5637/77

[51] Int. Cl.$^2$ .................. H01L 29/78; H01L 27/04; H01L 21/22
[52] U.S. Cl. .................. 357/23; 357/20; 357/42; 357/51; 357/89; 148/187
[58] Field of Search .................. 357/20, 89, 41, 42, 357/23, 51, 14

[56] References Cited

U.S. PATENT DOCUMENTS

| | | | |
|---|---|---|---|
| 3,374,406 | 3/1968 | Wallmark | 357/23 |
| 3,436,622 | 4/1969 | Warner, Jr. | 357/41 |
| 3,593,069 | 7/1971 | Madden | 357/51 |
| 3,608,189 | 9/1971 | Gray | 357/20 |
| 3,646,665 | 3/1972 | Kim | 357/42 |
| 3,821,776 | 6/1974 | Hayashi et al. | 357/42 |
| 3,898,105 | 8/1975 | Mai et al. | 357/41 |
| 3,967,295 | 6/1976 | Stewart | 357/41 |

Primary Examiner—William D. Larkins
Attorney, Agent, or Firm—Stevens, Davis, Miller & Mosher

[57] ABSTRACT

A CMOS integrated circuit structure is provided having circuit elements which can function as high resistances or stable current sources. The circuit elements include a region of intermediate doping which has a surface concentration between that of a substrate and a homogeneous region of a doped pocket formed therein. The region of intermediate doping is formed by the vicinity of two pocket edges, these edges being separated by a distance which is substantially not greater than twice the length of the lateral diffusion of the doping of the pockets.

4 Claims, 14 Drawing Figures

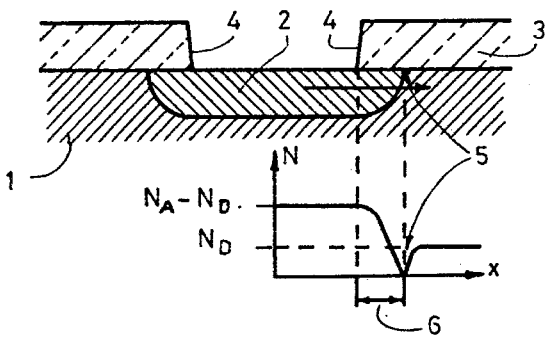
Fig. 1 a
Fig. 1 b
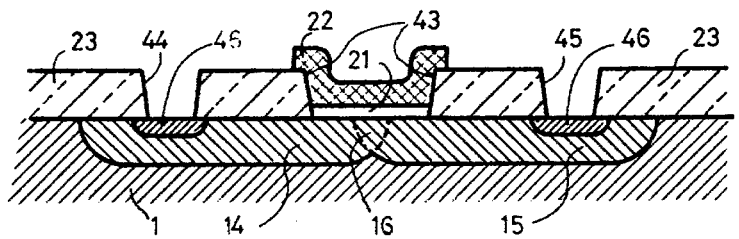
Fig. 5 a
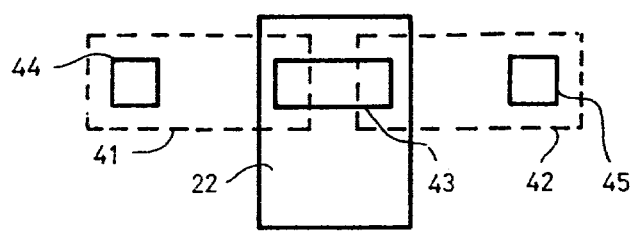
Fig. 5 b
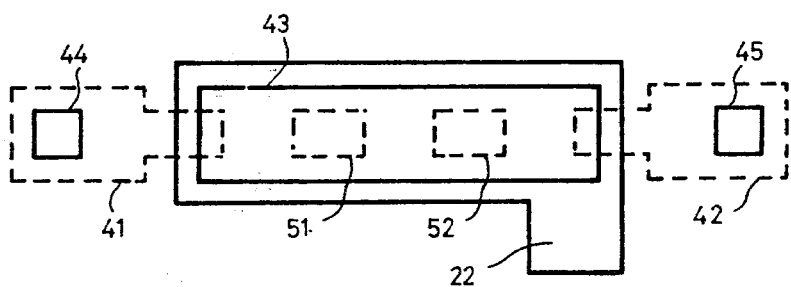
Fig. 6
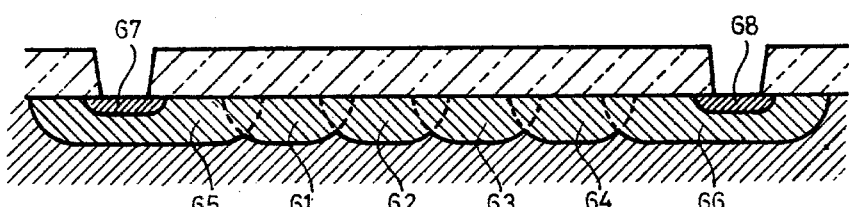
Fig. 7 a
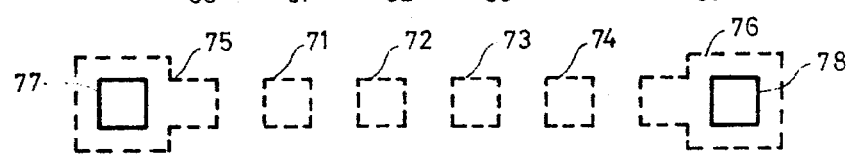
Fig. 7 b

INTEGRATED CIRCUIT STRUCTURE HAVING REGIONS OF DOPING CONCENTRATION INTERMEDIATE THAT OF A SUBSTRATE AND A POCKET FORMED THEREIN

BACKGROUND AND SUMMARY OF THE INVENTION

The present invention relates to an integrated circuit structure with complementary MOS transistors, comprising a semiconductor substrate in which are formed a first type of MOS transistor of a given type of conduction and at least one pocket doped opposite that of the substrate, in which is formed a second type of MOS transistor, of a type of conduction opposite the first.

In a complex circuit it is frequently necessary to arrange, on one and the same integrated circuit, MOS transistors of both types, and other elements which can serve as stable sources of current or high resistors. However, the present state of the art does not make is possible satisfactorily to meet this need. In fact, these additional elements are difficult to obtain by means of known structures. In order to obtain sources of current, for example, one must have recourse to circuit artifices which are not always satisfactory. Resistors formed of pocket diffusions have too high a doping and therefore too low a resistivity for certain applications.

Strictly speaking, it may be possible to supplement known technology by adding additional stages and masks to improve the characteristics of these elements. However, in practice the addition of one more stage or mask to the overall fabrication process results in a very substantial increase in the cost of the integrated circuit and more severe requirements in its fabrication if good quality is desired.

Accordingly, the object of the invention is to provide a complementary MOS transistor integrated circuit comprising additional circuit elements or electronic components which can serve as stable sources of current or high resistors without resulting in any substantial complication of the fabrication technology.

The MOS transistor integrated circuit structure constructed in accordance with the invention is characterized by the fact that it comprises an electronic component having a region of doping the concentration of which is intermediately between that of the substrate and of the pockets formed in the substrate. This region is formed by the vicinity of two pocket edges, the edges being separated by a distance which is substantially not greater than twice the length of the lateral diffusion of the doping of the pockets. The doping of this region is determined by the lateral diffusion of the pockets.

The invention therefore satisfies the above-mentioned need by providing a circuit whose construction does not involve any intolerable modification in existing technology, but simply certain details in the layout of the photolighographic masks. These pecularities consist essentially, as will be described, in providing either a narrow masking band in a pocket or a relatively narrow space between two pocket regions.

As background for the invention, one should consult the technology described in U.S. Pat. No. 3,646,665 to Kim or Swiss Pat. No. 542,518 which discloses an integrated circuit structure having complementary MOS transistors with a gate of silicon and doped oxides.

The obvious advantage provided by the present invention over the structure disclosed in this patent resides in the additional circuit components produced by means of the present invention.

These components may be resistors, with the advantage of a higher resistivity than that of conventional resistive pockets. These additional components may also be transistors which have a lower threshold voltage than that of the other transistors of the circuit which are made in known manner. One can even provide a threshold voltage such that a current flows with zero gate voltage, the component then constituting a very practical source of current. The threshold voltage may be selected between various values by selecting an appropriate width for the space between the two pocket edges. For an n-channel MOS transistor, for instance, if the width is very small the properties approach those of known transistor elements. If this width is on the order of magnitude of the junction depth, the intermediate doping region will have a very slightly doped zone and will have a lowered threshold voltage. However, this width can barely exceed twice the length of the lateral diffusion, otherwise the lateral diffusions would be disjointed and the component would no longer operate.

An integrated circuit is known having complementary MOS transistors and a third type of component. However, since the additional component in this case is a high-voltage transistor, problems are involved which are different from those addressed by the present invention. The starting technology is of the type described in U.S. Pat. No. 3,646,665 cited above and the methods of obtaining the high voltage transistor are described in the article by R. A. Blanchard et al entitled "High Voltage Simultaneous Diffusion Silicon-Gate CMOS", IEEE J. of Solid State Circuits, Vol. SC-9, No. 3, June 1974, pp. 103-110 (hereinafter Ref. 2).

Nothing in this article suggests the concept which forms the basis of the present invention, and the result obtained by the process disclosed therein is entirely different from that obtained by the present invention.

An integrated circuit structure is also known which involves the idea of using lateral diffusion. However, this structure is directed to a very different purpose from that of the present invention, namely, to obtain a very short channel, without special requirements for the mask. This purpose and the manner of carrying it out is described in the article by M. D. Poscha et al "Threshold Voltage Controllability in Double-Diffused MOST", IEEE Trans. on Electron Devices, Vol. ED-21, No. 12, Dec. 1974 (hereinafter Ref. 3).

In accordance with this article, a so-called double diffused MOS transistor comprises a very short channel obtained by lateral diffusion. The length of the channel is substantially the difference in lateral penetration of two successive diffusions of opposite doping agents diffused from the same region. The structure obtained is very different from that which is proposed in the present invention.

The latter article refers in particular to the problem which consists in controlling the threshold voltage of the fabricated transistor. But the purpose of the double-diffused MOST having a short channel in no way relates to a device having a reduced or zero threshold voltage; rather, the purpose is to obtain a transistor capable of good high frequency performance, particularly as a result of a short channel capable of conducting a high current with relatively low ohmic drop.

Moreover, with respect to the threshold voltage, it will be appreciated that the present invention makes it possible to definitely control this parameter, to the extend that transistors of different threshold values can be created as desired on the same circuit, by simply designing the masks accordingly.

The transistor described in the latter article raises certain problems as soon as one attempts to incorporate it, as component, in a integrated circuit structure. One of the problems is the insulation of the drain.

A technique which has made it possible to overcome this difficulty is described in the article by T. Masuhara and R. S. Muller "Complementary D-MOS Process for LSI" IEEE J. of Solid State Circuits, Vol. SC-11, No. 4, August 1976 (hereinafter Ref. 4).

The purpose of the technique described in this article is to create a new variety of integrated circuit with complementary MOS transistors. The CMOS's are extremely interesting for logical circuits of high density and low static current consumption. The idea presented consists in replacing, in the CMOS circuit, the transistors of one type, for instance the n-channel MOS's if the substrate is of n type, by a double-diffusion MOS transistor (DMOS). The DMOS described in this article is different from that of the Poscha et al article mentioned above (Ref. 3). The effects obtained consist primarily of a decrease in the number of masks necessary and in a saving in diffusion time and pocket area.

The present invention has importance in its own right, in view of the fact that it satisfies other requirements and produces other effects not discussed in this article. In particular, one of the advantages of the present invention is to add to a conventional CMOS structure components which assume functions as resistors or sources of current which previously could not be satisfactorily realized. This is entirely different from what is described in this article.

The invention will be better understood by means of the description given below with reference to the accompanying drawings, which illustrate, by way of example, several embodiments of the invention.

BRIEF DESCRIPTION OF THE DRAWINGS

FIG. 1a is a section through a known pocket structure and FIG. 1b is the corresponding profile of the doping surface concentration.

FIG. 5a is a section and FIG. 5b the corresponding mask plan of a p-channel MOS transistor constructed in accordance with another embodiment of the invention.

FIG. 6 illustrates a variant of the FIG. 5 embodiment showing a p-channel MOS transistor of large channel length.

FIGS. 7a and 7b show the construction of a high value resistor in accordance with still another embodiment of the invention.

DETAILED DESCRIPTION OF THE INVENTION

Figure 2A:
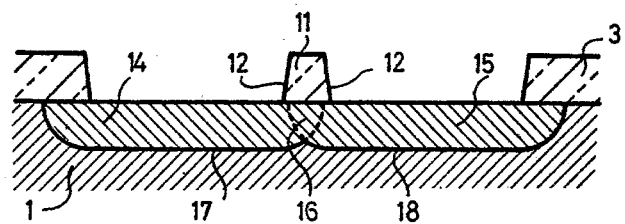
FIG. 2a is a cross section, and FIG. 2b a corresponding plan view of the base structure of the first embodiment of the invention during fabrication.

FIG. 1a shows a section taken through the structure of a known integrated circuit pocket in course of its manufacture (ref. 1). In CMOS technology, the MOSTs (insulated-gate field-effect transistors, commonly referred to as metal-oxide-semiconductor transistors, even if the gate is made of polycrystalline silicon instead of metal may be of two different, i.e., complementary, types. The p-channel transistors are located in a substrate 1, doped n−. The n-channel transistors are located in at least one pocket 2, formed as a p-doped region. This pocket is obtained by implantation or diffusion of an impurity into an opening in the oxide 3. The concentration of the doping at the surface of the pocket is uniform within this opening. The edges 4 of this opening generally define the edges of the pocket. However, because of high-temperature heat treatments a diffusion of the doping agent occurs, both in depth and laterally. Thus, at the edges of the pocket, the net doping on the surface decreases uniformly to a value of zero at the place of the p-n junction 5 between the substrate n− and pocket p−.

FIG. 1b shows a profile of the concentration N on the surface along the abscissa x. The concentration in the substrate is $N_D$. In the homogeneous pocket region of the substrate, the concentration of boron is $N_A$ and the net concentration of impurities is $|N_A - N_D|$. A transition zone 6 extends from the edge of the opening up to the p-n junction over a typical distance of several micrometers.

Figure 2B:
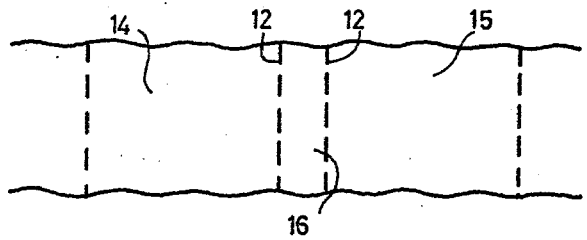

FIG. 2a shows in section, and FIG. 2b in top view, the base structure of one embodiment of the invention during fabrication. A weakly n− doped silicon substrate 1 is surmounted by a layer of oxide 3 having an opening intended to permit the passage of the boron doping atoms. This opening is interrupted by a masking strip 11 whose edges 12 are close to each other. In the top view (b) of this figure and in the following figures, the limits 12 of the diffusion openings of the pocket are shown in dashed lines. After the predepositing operations and heat treatments at high temperature, the substrate has two homogeneously doped zones 14 and 15, separated by an intermediate doping region 16 located below the masking strip 11. The surface concentration of intermediate doping region 16 is between that of the substrate 1 and the doping concentrations in a homogeneous region of the pockets 14, 15. It will be noted that in FIG. 2 the p-n junctions 17 and 18, respectively corresponding to each of the pockets after final diffusion, have been shown. In the median zone 16, the superimposing of the concentrations coming from each opening will move the resultant p-n junction downward but not to the same level as the pockets p-n junctions 17 and 18. During the subsequent stages of fabrication, the oxide layer 3 is eliminated and a new layer of oxide is grown thermally on the entire surface. Only the structure below the surface of the semiconductor remains. By causing the channel of an MOS transistor to coincide with the median zone 16, one will obtain an element having characteristics which differ from the characteristics of the MOS transistors localized either in the homogeneous region of a pocket or in the substrate. By incorporating at least one such median zone 16 in a resistor formed of diffusions of the pocket, one obtains a resistance of higher value for the same surface than if it were formed of homogeneous diffusions.

Figure 3A:
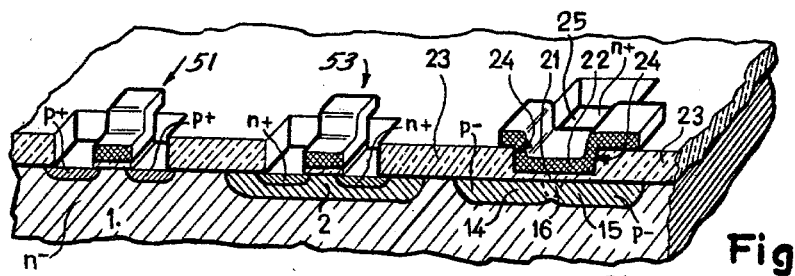
FIG. 3a is a perspective view and FIG. 3b a mask plan of an n-channel MOS transistor in a C-MOS environment constructed in accordance with the first embodiment of the invention.
Figure 3B:
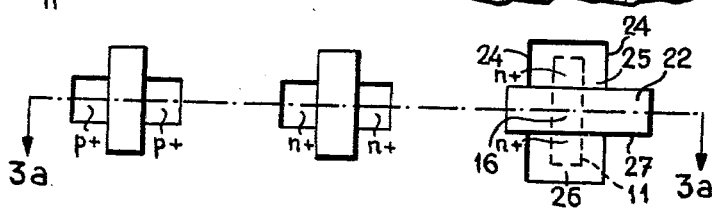

FIG. 3a is a perspective view and FIG. 3b the mask plan of an n-channel MOS transistor constructed in accordance with the invention in a C-MOS structure having complementary transistors 51 and 53, the latter being formed in a pocket of doping formed in the substrate. The n-channel MOS transistor has a threshold voltage lowered as compared with the MOS transistors located in the homogeneous zones of the pockets. The figures are directed to the CMOS technology with polycrystalline Si gate such as described in U.S. Pat. No. 3,646,665, and show an intermediate stage of fabrication. As in FIG. 2a, a substrate 1 having diffused zones 14 and 15 therein, separated by an intermediate doping region 16 whose surface concentration is lower than in the homogeneous regions 14 and 15, is provided. This region is obtained by a masking strip (11, FIG. 2a) of the pocket mask. It is surmounted by a thin oxide 21 and a layer of polycrystalline silicon 22 forming the gate of the MOS transistor. The width of the MOS transistor is limited by the sides 24 of a thick oxide 23 (which is not the one which serves to define the regions 14, 15, and 16). The source region 25 and the drain region 26 of the MOS transistor are located in a plane and are visible in the plan view of FIG. 3b. These regions are defined by an n+ diffusion (phosphorus) through the opening 24 of the oxide 23 at the places not masked by the gate defined by the edge 27. The depth of the n+ junction must be less than that of the adjacent pocket. The MOS transistor of FIG. 3 differs from a conventional n-channel MOS transistor located in a homogeneous pocket because of the presence of the reduced doping region 16 below the gate and therefore in the region of the channel. With this construction, this region is inverted more easily under the effect of a positive voltage applied to the gate. The transistor thus obtained has a lower threshold voltage than a normal MOS transistor and may even be conductive at a zero gate voltage (depletion MOS transistor). The threshold voltage of this MOS transistor depends on the width of the masking strip (11, FIG. 2a) used upon the diffusion of the pockets. It can therefore be adjusted by suitably modifying the mask of the pockets.

The subsequent operations in the fabrication of the transistor are not shown in FIG. 3a since they are not different from known processes (Ref. 1). It will be noted that, contrary to the known double diffusion transistor structures (Refs. 3 and 4), the doping here is substantially homogeneous along a current line extending from the source 25 to the drain 26. On the other hand, the doping varies from the edges to the center of the channel. This transistor behaves as a plurality of transistors connected in parallel having substrates of different doping concentrations. It is the central zone, with its low effective impurity concentration, which contributes most of all to causing the MOS transistor to conduct at a low gate voltage. Up from a voltage close to the threshold value of the normal transistors in the same substrate, current flows thru the entire section. This MOS transistor therefore has a progressive threshold (remote cut-off).

Figure 4A:
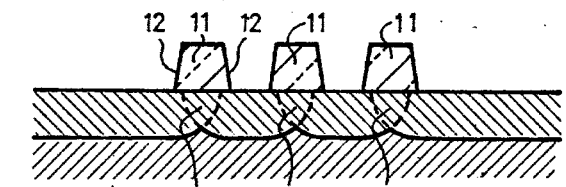
FIGS. 4a, 4b and 4c illustrate a variant of the embodiment of FIGS. 2a and 2b showing an n-channel MOS transistor with large channel width.
Figure 4B:
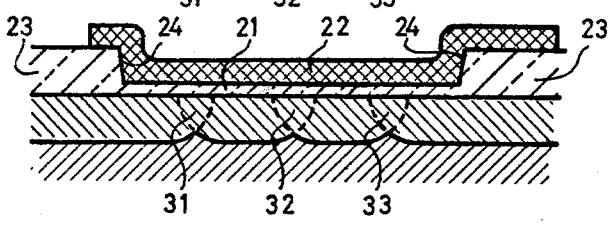
Figure 4C:
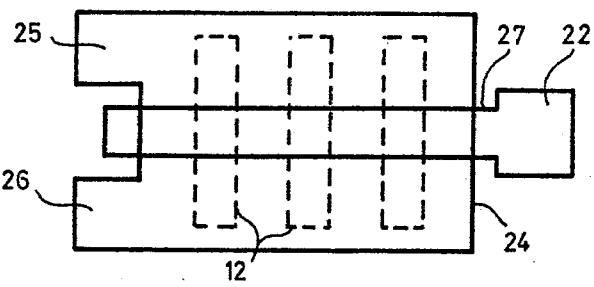

FIGS. 4a, 4b and 4c illustrate a variant of the preceding embodiment showing a transistor of large width and low threshold voltage obtained by the placing in parallel of a plurality of intermediate doping region. FIG. 4a shows several masking strips in the same stage of fabrication as in FIG. 2a. These strips define several (in this case 3) intermediate doping regions 31, 32, 33. FIG. 4b shows a section through a wide MOS transistor in the same stage of fabrication as in FIG. 3a. The intermediate doping regions 31, 32, 33 are distributed over the width of the channel. FIG. 4c shows the mask plans of the same structure, namely the pocket masks 12, diffusion opening 24, and polycrystalline silicon gate 27. Such a transistor is capable of supplying a large current with zero gate voltage. This current depends little on the drain-source voltage, provided that it is greater than a saturation voltage ($V_{Dsat}$) corresponding to the pinch voltage of the channel.

FIGS. 5a and 5b refer to a p-channel transistor located in the substrate, which has a reduced threshold voltage as compared with conventional p-channel transistors obtained using the above described prior art technology. They show the cross section (FIG. 5a) and the mask plans (FIG. 5b) after deposition and etching of the polycrystalline silicon layer defining the gates. The structure comprises a substrate 1 in which the pocket diffusion has been effected through the openings 41 and 42, separated by a short distance. The p− diffusions 14 and 15 have between them a region 16 of intermediate doping between that of the substrate (n−) and that of the homogeneous pockets (p−). This intermediate doping region may be at its center either of n−type or of p− type. The semi-conductor is covered with a field oxide layer 23. In this layer, an opening 43 defines the gate region, which is located astride the region common to the two pocket openings. Two openings 44 and 45 define the source and drain anchorings. The central opening is covered with a thin oxide 21 and with polycrystalline silicon 22 forming the gate of the MOS transistor. The openings 44 45 are provided for the p+ diffusion anchorings 46. These dopings may be obtained for instance by means of doped oxides applied in a subsequent phase of fabrication and etched selectively (Ref. 1).

The structure of FIGS. 5a and 5b has the properties of an MOS depletion transistor if the openings 41 and 42 are sufficiently close, so that one obtains a slight overlap of the diffusions in the region 16. The distance between the openings determines the threshold voltage, while the width of this transistor determines its transconductance.

FIG. 6 shows the mask plans of a variant of the preceding embodiment, corresponding to an MOS transistor of very low transconductance. Such MOS transistors may prove extremely useful for the supplying of small polarizing currents in circuits of low consumption. If, in the structure of FIG. 5a, the pockets 41 and 42 have the smallest width compatible with good fabrication yield and if the MOS thus obtained has a current gain which is still too high for the purpose sought, a lower current gain can be obtained by the composite structure of FIG. 6, which corresponds to a plurality of MOS transistors of minimum width placed in series. Intermediate islands defined by the openings of the pocket 51 and 52 are interposed between the openings 41 and 42 of the source and drain pockets.

FIGS. 7a and 7b show a longitudinal section and the mask plans for a high valued resistor. The structure comprises a chain of small regions of p− diffusion (pocket) 61 to 64 interposed between two larger diffusions 65 and 66 in which p+ diffusions 67 and 68 are provided to assure ohmic contacts. The spaces between two diffused regions such as 61 and 62 are selected so as to provide intermediate regions of very reduced p− doping. The average resistance of such structure is higher than that of a continuous p− diffusion band, which makes it possible to save space and decrease the parasitic capacitance of a diffused resistor, without changing the concentration of the doping of the pockets.

FIG. 7b shows the mask plan comprising the pocket openings 71 and 74, intended to produce the small p− diffusion regions, the openings 75 and 76 for the larger regions, and the openings 77 and 78 intended for the p+ diffusion of the ohmic contacts of the resistor.

Although several specific embodiments of the invention have been described, various modifications thereof will readily occur to those skilled in the art. Accordingly, the structures and processes described are to be taken as merely exemplary and not as limiting the invention which is defined by the following claims.

What is claimed is:

1. An integrated circuit comprising a semi-conductor substrate of a first conductivity type, at least one pocket of doping formed in said substrate which has a conductivity opposite said first type, said pocket having a lateral diffusion of doping extending beyond the edges thereof, and at least one metal oxide semiconductor transistor having spaced drain and source regions of said first conductivity type in at least one of said pockets and a gate formed above the semi-conductor substrate surface between said drain and source regions by a thin dielectric film covered by a conducting material, the region under said gate defining a channel and having a surface doping concentration between that of said substrate and that of said pocket, said channel having side boundaries defined by two substantially parallel lines running from said source region to said drain region, said region being formed by the proximity of two adjacent pocket edges, said edges being substantially parallel to said lines running from said source region to said drain region in the channel and being separated by a space which is substantially not greater than twice the length of the lateral diffusion of the doping between a pocket edge, the doping of said region being accomplished by the lateral diffusion of said adjacent pocket edges.

2. An integrated circuit according to claim 1 wherein said channel has, beneath said gate, at least one region of intermediate doping obtained by the use of a masking band during pocket diffusion.

3. An integrated circuit according to claim 1 or 2 wherein said channel has, beneath said gate, several regions of intermediate doping therein distributed over the width of said channel.

4. An integrated circuit structure according to claim 1 wherein said substrate is n-doped and said pocket is p-doped, and said metal oxide semiconductor transistor is of the N-channel type.

* * * * *

UNITED STATES PATENT AND TRADEMARK OFFICE
CERTIFICATE OF CORRECTION

PATENT NO. : 4,205,342
DATED : May 27, 1980
INVENTOR(S) : Mougahed Y. Darwish; Henri J. Oguey It is certified that error appears in the above-identified patent and that said Letters Patent are hereby corrected as shown below:

The assignee's name was changed from "Centre Electronique Horologer S. A." to --Centre Electronique Horloger S. A.--.

Signed and Sealed this

Second Day of September 1980

[SEAL]

Attest:

SIDNEY A. DIAMOND

Attesting Officer

Commissioner of Patents and Trademarks